United States Patent
Aoki et al.

(10) Patent No.: US 10,615,143 B2
(45) Date of Patent: *Apr. 7, 2020

(54) INJECTION MOLDED SOLDER BUMPING

(71) Applicant: INTERNATIONAL BUSINESS MACHINES CORPORATION, Armonk, NY (US)

(72) Inventors: Toyohiro Aoki, Kawasaki (JP); Takashi Hisada, Kawasaki (JP); Eiji Nakamura, Kawasaki (JP); Kuniaki Sueoka, Kawasaki (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/988,351

(22) Filed: May 24, 2018

(65) Prior Publication Data

US 2018/0277509 A1 Sep. 27, 2018

Related U.S. Application Data

(63) Continuation of application No. 15/454,229, filed on Mar. 9, 2017, now Pat. No. 10,037,967.

(51) Int. Cl.
*H01L 23/00* (2006.01)
*B23K 3/06* (2006.01)
(Continued)

(52) U.S. Cl.
CPC ............ *H01L 24/81* (2013.01); *B23K 1/0016* (2013.01); *B23K 3/0623* (2013.01); *B23K 35/0238* (2013.01); *B23K 35/0244* (2013.01); *H01L 21/565* (2013.01); *H01L 24/11* (2013.01); *H01L 24/05* (2013.01); *H01L 2224/0345* (2013.01);
(Continued)

(58) Field of Classification Search
None
See application file for complete search history.

(56) References Cited

U.S. PATENT DOCUMENTS 8,492,262 B2 7/2013 Gruber et al.
8,921,221 B2 12/2014 McLeod et al.
(Continued)

FOREIGN PATENT DOCUMENTS

JP 5955036 7/2016

OTHER PUBLICATIONS

Koichi Hasegawa et al., Development status of photoresist as mask material for Injection Molded Solder (IMS) technique, 2016 Pan Pacific Microelectronics Symposium (Pan Pacific), Big Island, HI, Jan. 2016, pp. 1-6.
(Continued)

*Primary Examiner* — Asok K Sarkar
(74) *Attorney, Agent, or Firm* — Tutunjian & Bitetto, P.C.; Vazken Alexanian

(57) ABSTRACT

Methods for depositing material on a chip include forming a mold layer. The mold layer includes one or more openings over respective contact areas, each of the one or more openings having an upper volume and a lower volume. The upper volume has a smaller diameter than a diameter of the lower volume. Each contact area is within the respective lower volume. A material is injected into the one or more openings under pressure.

11 Claims, 4 Drawing Sheets

(51) Int. Cl.
    *B23K 1/00* (2006.01)
    *B23K 35/02* (2006.01)
    *H01L 21/56* (2006.01)
(52) U.S. Cl.
    CPC .............. *H01L 2224/03464* (2013.01); *H01L 2224/0401* (2013.01); *H01L 2224/0568* (2013.01); *H01L 2224/05639* (2013.01); *H01L 2224/05644* (2013.01); *H01L 2224/05647* (2013.01); *H01L 2224/05655* (2013.01); *H01L 2224/05666* (2013.01); *H01L 2224/05669* (2013.01); *H01L 2224/05676* (2013.01); *H01L 2224/05678* (2013.01); *H01L 2224/05681* (2013.01); *H01L 2224/05683* (2013.01); *H01L 2224/05684* (2013.01); *H01L 2224/11312* (2013.01); *H01L 2224/11472* (2013.01); *H01L 2224/11474* (2013.01); *H01L 2224/11622* (2013.01); *H01L 2224/11849* (2013.01); *H01L 2224/94* (2013.01); *H01L 2924/1033* (2013.01); *H01L 2924/10252* (2013.01); *H01L 2924/10253* (2013.01); *H01L 2924/10271* (2013.01); *H01L 2924/10272* (2013.01); *H01L 2924/10329* (2013.01)

(56) References Cited

U.S. PATENT DOCUMENTS

| | | |
|---|---|---|
| 10,037,967 B1 * | 7/2018 | Aoki ..................... H01L 24/81 |
| 2012/0146212 A1 | 6/2012 | Daubenspeck et al. |
| 2014/0069817 A1 | 3/2014 | Deng et al. |

OTHER PUBLICATIONS

Jae-Woong Nah et al., Wafer IMS (Injection Molded Solder)—A New Fine Pitch Solder Bumping Technology on Wafers with Solder Alloy Composition Flexibility, 2014 IEEE 64th Electronic Components and Technology Conference (ECTC), Orlando, FL, May 2014, pp. 1308-1313.

Nagase Chemtex Corporation, http://www.nagasechemtex.co.jp/eni, Accessed Sep. 8, 2016.

List of IBM Patents or Patent Applications Treated as Related dated May 24, 2018, 2 pages.

* cited by examiner

INJECTION MOLDED SOLDER BUMPING

BACKGROUND

Technical Field

The present invention generally relates to injection molded soldering and, in particular, to the use of mask cavities to reduce the pressure needed to inject solder.

Description of the Related Art

Injection molded soldering injects molten solder into vacuumed cavities on a patterned resist mask. Referring now to FIG. 1, a cross-sectional view of a conventional injection molded soldering process is shown. A contact pad 108 represents the under-bump metal (UBM) on a substrate 102. A resist mask 104 is formed around the contact pad 108, with a gap over the contact pad 108. The injection head 106 passes over the resist mask 104, injecting solder 110 into the cavity.

However, residual gas may remain in the cavity and have a negative effect on how the solder 110 fills the cavity. For example, bubbles may remain in the solder that weaken the solder joint and/or impede conductivity. When the molten solder makes contact with the UBM 108, residual gas can be removed by wetting of the solder on the UBM 108. If no such contact is made, then the residual cannot be removed by such wetting. It is difficult to remove this gas entirely, because there is often leakage between the solder injection head 106 and the resist mask 104.

One way to improve solder contact is to increase the injection pressure. However, higher injection pressure necessitates a correspondingly high injection head pressure, which can negatively affect the solder formation by deforming the mask 104. This puts an upper limit on how much pressure can realistically be applied by the injection head. For finer pitch bumping, even higher injection pressures are needed.

SUMMARY

A method for depositing material on a chip includes forming a mold layer. The mold layer includes one or more openings over respective contact areas, each of the one or more openings having an upper volume and a lower volume. The upper volume has a smaller diameter than a diameter of the lower volume. Each contact area is within the respective lower volume. A material is injected into the one or more openings under pressure.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide injection molded solder application that uses resist masks with cavities which provide gas displacement during injection. These cavities thereby decrease the amount of pressure needed to inject the solder material, which in turn decreases the amount of injection head pressure that needs to be applied and decreases the potential for damage and deformity in the resist mask.

In a first embodiment, the cavities are formed in the resist mask by creating the resist mask in a two-layer process. In another embodiment, the cavities are formed by defocusing a beam of curing light during exposure, such that the width of the cavity changes. In addition, multiple embodiments for the cavity structures are provided herein.

Figure 1:
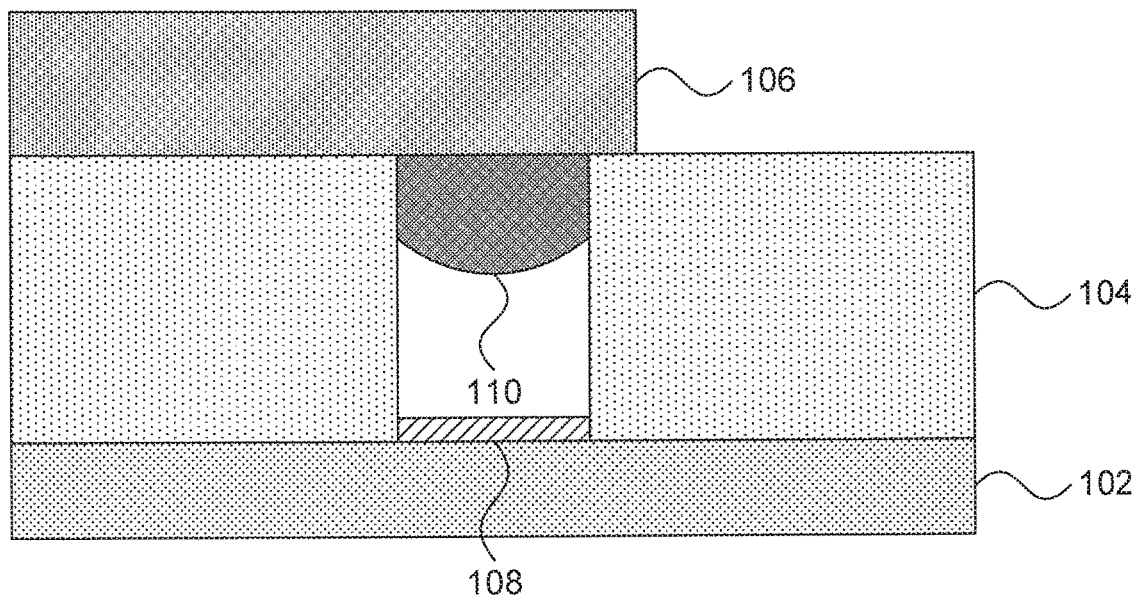
FIG. 1 is a cross-sectional diagram of prior art solder injection.

Referring again to FIG. 1, once the injection head 106 in a conventional injection molded solder system covers the cavity and solder begins to be injected, the gas in the cavity can be sealed in the cavity. At this point, any gas remaining in the cavity will be compressed as additional solder 110 is injected and occupies additional volume in the cavity. At some point, the pressure of the compressing gas may equal the injection pressure, which is limited by the amount of downward force applied by the injection head 106. If insufficient injection pressure is applied, the solder 110 may never contact the contact pad 108, leaving an air gap in the cavity that prevents an electrical connection from being formed.

To avoid this problem, the present embodiments increase the volume of the cavity at its base. This gives space for the gas to displace into as the solder 110 fills the cavity, thereby lowering the pressure of the gas and decreasing the amount of downward pressure that the injection head 106 needs to exert. The amount of pressure that is needed for the solder 110 to make contact with the contact pad 108 will depend on the dimensions of the cavity.

Figure 2:
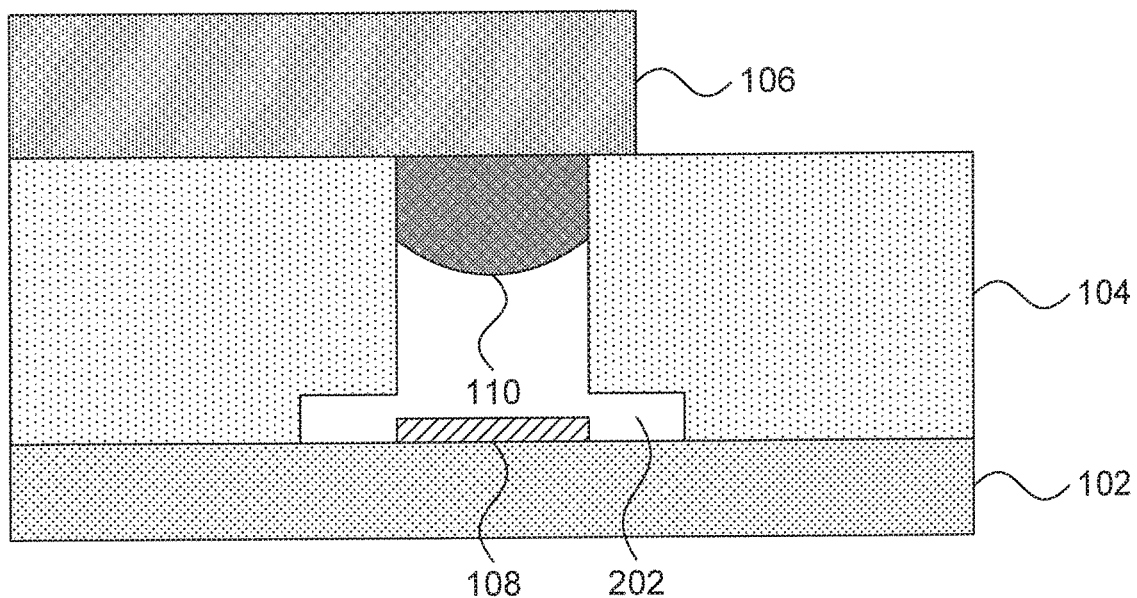
FIG. 2 is a cross-sectional diagram of low-pressure solder injection in accordance with the present embodiments.

Referring now to FIG. 2, a cross-sectional view of an injection molded soldering process is shown. In particular, this embodiment shows an extended cavity 202 which has a width in a bottom portion that is greater than that of the contact pad 108 and a width in an upper portion that is the same as that of the contact pad 108. It should be understood that the width of the upper portion may alternatively be greater or less than that of the contact pad 108.

In this embodiment, as the solder 110 pushes down into the cavity 202, the remaining gas inside the cavity 202 compresses and the pressure inside the cavity 202 rises. However, because the cavity 202 has a greater volume than a conventional cavity would, the gas partially displaces into the extended portions to the left and right of the contact pad 108. As a result, the pressure that the gas reaches by the time the solder 110 comes into contact with the contact pad 108 is below the limit of pressure that the injection head 106 can safely exert.

The dimensions of the cavity 202 may be selected to allow the solder 110 to make contact with the contact pad 108 without over-filling to the point where the solder 110 pushes laterally past the boundaries of the contact pad 108. The thicker the resist mask 104 is, the more gas will be trapped and, therefore, the wider the cavity 202 will need to be to accommodate the displaced gas at pressures that are suitable for solder injection.

When determining the dimensions for the cavity 202, including the dimensions for the additional volume, parameters that influence the design include the expected initial pressure of the remaining gas, the expected contact angle between the molten solder and the mold sidewall, and the resist thickness. With thicker resist layers, the vacant space in the mold cavities can be made taller, thereby providing more volume for displaced gas. More volume therefore means that the pressure needed to inject solder decreases. The present embodiments can provide any arbitrary degree of decrease the injection pressure that is needed.

Figure 3:
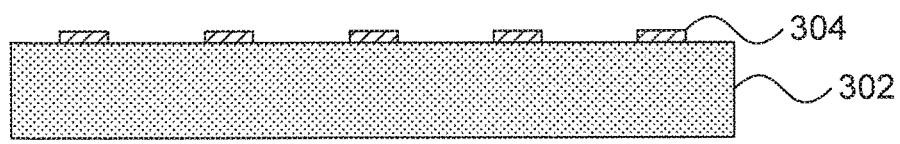
FIG. 3 is a cross-sectional diagram of a step in the formation of mask cavities for low-pressure solder injection in accordance with the present embodiments.

Referring now to FIG. 3, a cross-sectional view of a step in an injection molded soldering process is shown. A semiconductor substrate 302 is provided with a series of contact pads 108. It is specifically contemplated that the semiconductor substrate 302 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multilayers thereof. Although silicon is the predominantly used semiconductor material in wafer fabrication, alternative semiconductor materials can be employed, such as, but not limited to, germanium, gallium arsenide, gallium nitride, cadmium telluride and zinc selenide. Although not depicted in FIG. 3, the semiconductor substrate 302 may also be a semiconductor on insulator (SOI) substrate. Non-semiconductor substrate materials may furthermore be employed instead of a semiconductor material.

The contact pads 304 are formed from a conductive material. For example, while the contact pads 304 are often formed from copper, alternative materials may include tungsten, nickel, titanium, molybdenum, tantalum, platinum, silver, gold, rubidium, iridium, rhenium, ruthenium, and alloys thereof. It is specifically contemplated that the contact pads 304 provide an electrical interface to components formed on or in the substrate 302, but contact pads 304 may alternatively be included solely for structural contacts. The contact pads 304 may be formed on the substrate 302 by any appropriate process such as, e.g., electroless plating. In one specific embodiment, electroless deposition of copper may rely on the presence of a reducing agent, for example formaldehyde, which reacts with the copper metal ions to deposit the metal. In a further embodiment, the contact pads 304 may be deposited using a sputter process.

Figure 4:
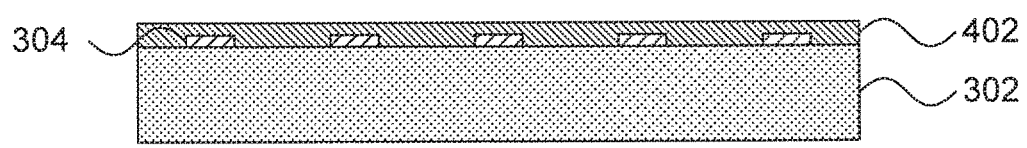
FIG. 4 is a cross-sectional diagram of a step in the formation of mask cavities for low-pressure solder injection in accordance with the present embodiments.

Referring now to FIG. 4, a cross-sectional view of a step in an injection molded soldering process is shown. A first resist layer 402 is deposited over the substrate 302 and the contact pads 304. It is specifically contemplated that the first resist layer 402 may be formed from, e.g., polymethylglutarimide (PMGI) or any other appropriate lift-off resist material. The first resist layer 402 may be deposited using a spin-on process to evenly distribute the resist material across the substrate 302. The first resist layer 402 may then be soft-baked at, e.g., about 150° C. to about 200° C. to partially harden the first resist layer 402.

Figure 5:
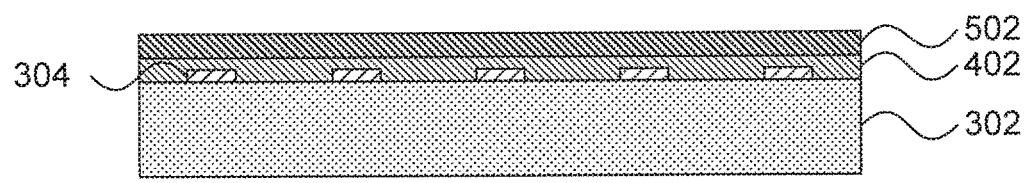
FIG. 5 is a cross-sectional diagram of a step in the formation of mask cavities for low-pressure solder injection in accordance with the present embodiments.

Referring now to FIG. 5, a cross-sectional view of a step in an injection molded soldering process is shown. A second resist layer 502 is formed on top of the first resist layer 402. Any appropriate imaging resist material may be used. The second resist layer 502 is deposited using, e.g., a spin-on process and is then soft-baked in place.

Figure 6:
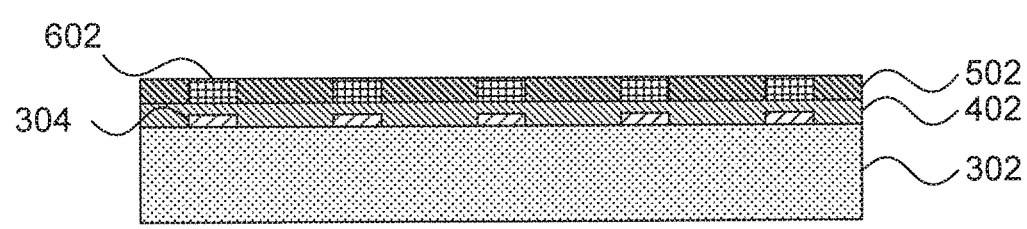
FIG. 6 is a cross-sectional diagram of a step in the formation of mask cavities for low-pressure solder injection in accordance with the present embodiments.

Referring now to FIG. 6, a cross-sectional view of a step in an injection molded soldering process is shown. The second resist layer 502 is patterned by, e.g., exposing the resist to ultraviolet light or by any other patterning process that is appropriate to the material of the second resist layer 502. The exposure chemically changes the exposed regions 602.

Figure 7:
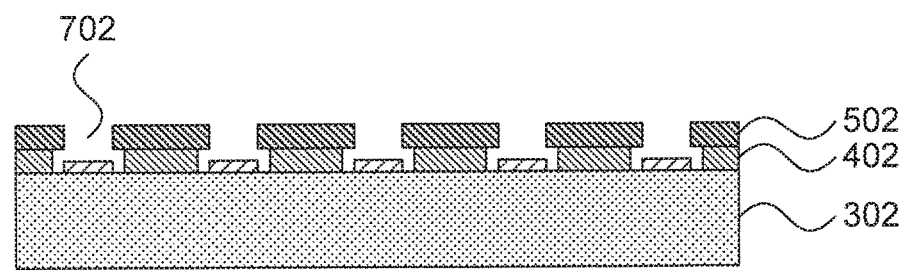
FIG. 7 is a cross-sectional diagram of a step in the formation of mask cavities for low-pressure solder injection in accordance with the present embodiments.

Referring now to FIG. 7, a cross-sectional view of a step in an injection molded soldering process is shown. The exposed regions 602 of the second resist layer 502 and portions of the first resist layer 402 underlying the exposed regions 602 are developed and etched away. The removal of this material leaves behind cavities 702 in the resist layers 402 and 502 for subsequent solder injection.

It should be noted that the material of the first resist layer 402 need not be separately exposed to a curing or patterning light. Instead, the material may be removed using, e.g., a timed, isotropic etch that selectively removes material from the first resist layer 402 without harming the material of the second resist layer 502.

It should be noted that the above is just one embodiment for the formation of cavities. Instead of the above, any appropriate method for forming cavities to accommodate gas pressure may be used. Several more such embodiments are discussed herein, and it should be understood that the methods of forming the cavities are intended to be illustrative and not limiting. Regardless of the particular shape of the cavities or the method of fabrication of the mask, solder injection for all of the present embodiments is performed according to the same process.

Figure 8:
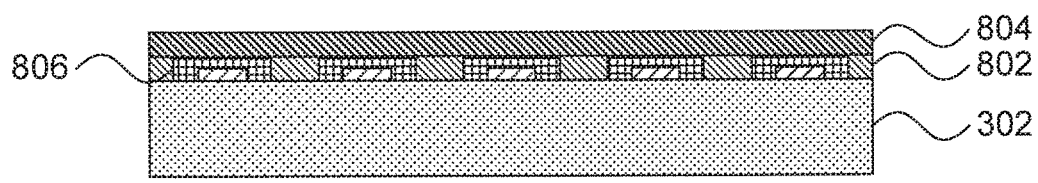
FIG. 8 is a cross-sectional diagram of a step in the formation of mask cavities for low-pressure solder injection in accordance with the present embodiments.

Referring now to FIG. 8, a cross-sectional view of an alternative step in an injection molded soldering process is shown. In this embodiment, the first resist layer 802 is soft-baked and exposed before the second resist layer 804 is deposited, creating exposed regions 806. The second resist layer 804 is then coated over the surface of the first resist layer 802. Some candidates for the materials of the first resist layer 802 and the second resist layer 806 include, e.g., novolak resin and phenol resin, though it should be understood that alternative materials may be used instead.

Figure 9:
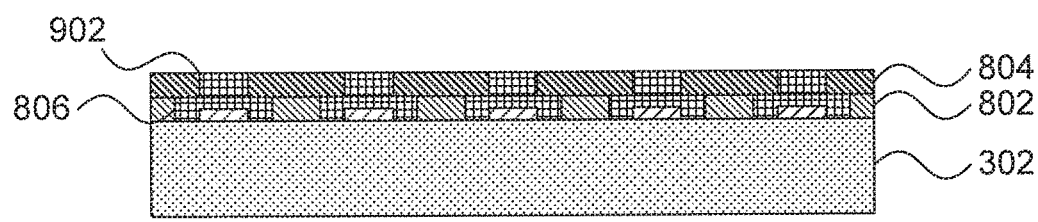
FIG. 9 is a cross-sectional diagram of a step in the formation of mask cavities for low-pressure solder injection in accordance with the present embodiments.

Referring now to FIG. 9, a cross-sectional view of an alternative step in an injection molded soldering process is shown. After the first resist layer 802 is exposed and the second resist layer 804 is formed, the second resist layer 804 is exposed. The exposed regions 902 of the second resist layer 804 are directly above the exposed regions 806 of the first resist layer 802. The mask used to define the exposed regions 902 of the second region 804 will also block regions outside the exposed regions 902 over the first resist layer 802. The exposed regions 806 and 902 of the first resist layer 802 and the second resist layer 804 respectively are then etched away, leaving cavities such as those shown in FIG. 7.

Figure 10:
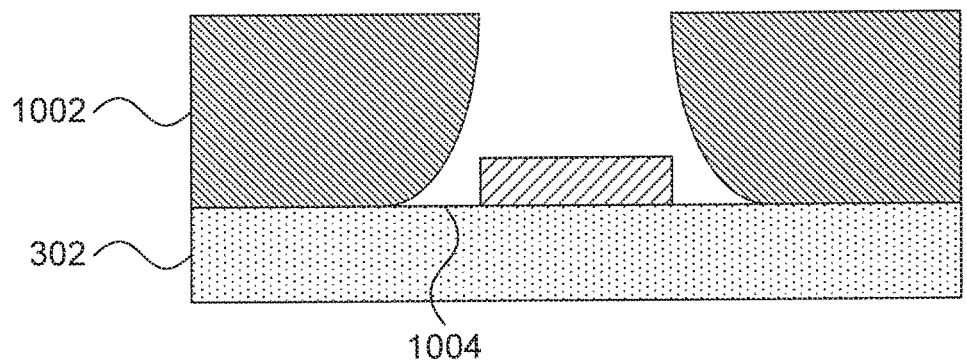
FIG. 10 is a cross-sectional diagram of a cavity for low-pressure solder injection in accordance with the present embodiments.

Referring now to FIG. 10, a cross-sectional view of an alternative step in an injection molded soldering process is shown. In this embodiment, a single resist layer 1002 is deposited. During exposure, the light beam is defocused, resulting in the beam spreading as it nears the substrate 302. The shape of the exposed region 1004 is wider near the substrate, such that when the exposed material is removed, cavities will remain to accommodate increased gas pressure.

Figure 11:
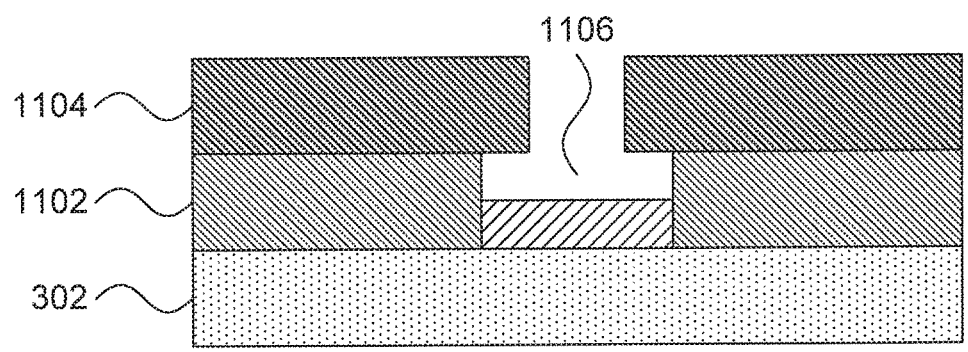
FIG. 11 is a cross-sectional diagram of a cavity for low-pressure solder injection in accordance with the present embodiments.

Referring now to FIG. 11, a cross-sectional view of an alternative step in an injection molded soldering process is shown. In this embodiment, a first resist layer 1102 and a second resist layer 1104 are patterned by any appropriate process to create a cavity 1106 that has a width in the first resist layer 1102 that is about the same width as the contact pad. In this example, the height of the lower portion of the cavity 1106 is greater than the expected height for the injected solder. The additional vertical height provides room for the compressed gas to displace into, thereby allowing the injected solder to make contact with the contact pad.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as it illustrated in the FIGS. It will be understood that the spatially relative terms are intended to encompass different orientations of the device in use or operation in addition to the orientation depicted in the FIGS. For example, the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 12:
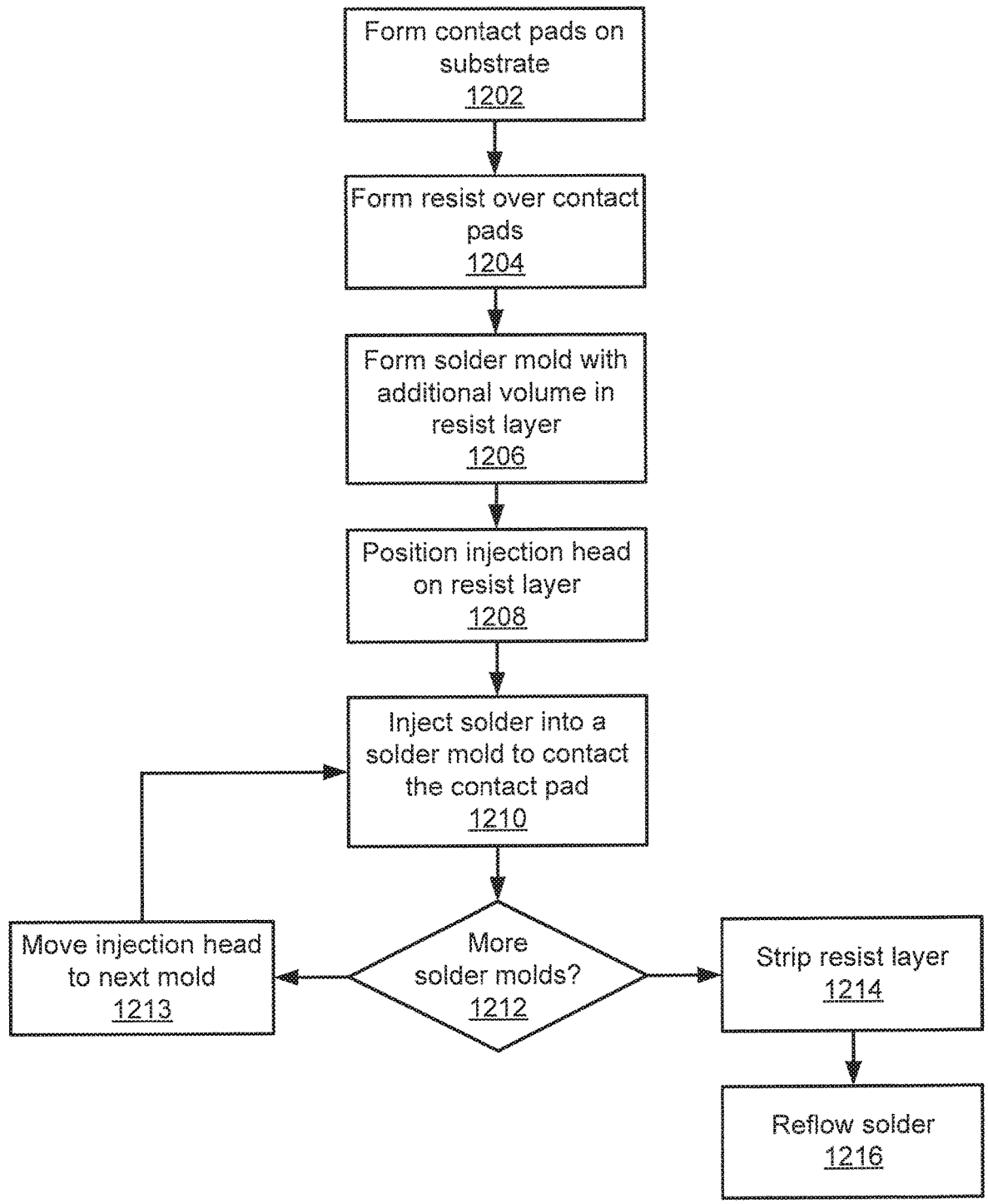
FIG. 12 is a block/flow diagram of a method for low-pressure solder injection in accordance with the present embodiments.

Referring now to FIG. 12, a process for solder injection is shown. Block 1202 forms the contact pads 108 on the substrate 102. Block 1204 forms a resist layer over the contact pads. It should be noted that the resist layer may be a single-layer resist or a double-layer resist as described in the various embodiments above. It should furthermore be noted that other configurations of resist are also contemplated and may be employed in accordance with design needs. Block 1206 forms a solder mold in the resist layer over each contact pad 108. The solder molds each have multiple diameters, with at least one diameter being the same as a diameter of the contact pads. In some embodiments, an upper portion of the mold has a greater diameter than a lower portion of the mold, in some embodiments a lower portion of the mold has a greater diameter than an upper portion of the mold, and in still other embodiments the diameter of the mold changes continuously along the height of the mold. In all embodiments, the mold includes at least one cavity in addition to the volume needed to accommodate the injected solder. The additional volume of the cavity accommodates gas that is displaced by the injected solder 110.

Block 1208 positions an injection head 106 on the resist layer. Pressure is applied by the injection head 106 on the resist layer to force the injection head 106 to remain in contact with the resist layer while solder is injected under pressure in block 1210. The solder 110 pushes down into the mold to make contact with the contact pad 108. In doing so, any gas remaining in the mold is compressed and displaced into the additional volume of the cavities.

Block 1212 determines whether there are any unfilled solder molds. If so, block 1213 moves the injection head 106 to the next solder mold and block 1210 injects solder into that solder mold. This process continues until all of the solder molds are filled. Block 1214 then strips the resist layer. Block 1216 reflows the solder, forming solder balls that are suitable for use in mounting other device components.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for depositing material on a chip, comprising:
   forming a mold layer that includes only a single resist layer on a substrate, the mold layer comprising one or more openings over respective contact areas, each of the one or more openings including an upper volume and a lower volume, the upper volume having a smaller diameter than a diameter of the lower volume, wherein each contact area is within the respective lower volume; and
   injecting a material into the one or more openings under pressure.

2. The method of claim 1, wherein forming the mold layer further comprises exposing the single resist layer over the respective contact areas and defocusing a light beam during exposure.

3. The method of claim 1, wherein the diameter of the upper volume is substantially similar to a diameter of the contact areas.

4. The method of claim 1, wherein the diameter of the lower volume is substantially similar to a diameter of the contact areas.

5. The method of claim 1, wherein the molten material is solder and wherein injecting the molten solder causes the molten solder to wet onto the contact areas when the molten solder makes contact with the contact areas.

6. A method for depositing material on a chip, comprising:
   forming a mold layer with one or more openings over respective contact areas by:
      forming a first resist layer over a substrate;
      forming a second resist layer over the first resist layer; and
      exposing the second resist layer in a volume above respective contact areas,
   wherein each of the one or more openings includes an upper volume and a lower volume, the upper volume having a smaller diameter than a diameter of the lower volume, and wherein each contact area is within the respective lower volume; and
   injecting a material into the one or more openings under pressure.

7. The method of claim 6, wherein forming the mold further comprises etching away the exposed volume of the second resist layer and underlying material of the first resist layer to form the one or more openings.

8. The method of claim 6, wherein forming the mold further comprises exposing the first resist layer before depositing the second resist layer over the first resist layer.

9. The method of claim 6, wherein the diameter of the upper volume is substantially similar to a diameter of the contact areas.

10. The method of claim 6, wherein the diameter of the lower volume is substantially similar to a diameter of the contact areas.

11. The method of claim 6, wherein the molten material is solder and wherein injecting the molten solder causes the molten solder to wet onto the contact areas when the molten solder makes contact with the contact areas.

* * * * *